US011342518B2

United States Patent
Kim et al.

(10) Patent No.: US 11,342,518 B2
(45) Date of Patent: May 24, 2022

(54) FLEXIBLE ELECTROLUMINESCENT DISPLAY APPARATUS

(71) Applicant: LG Display Co., Ltd., Seoul (KR)

(72) Inventors: DaeKyung Kim, Paju-si (KR); JaeSung Jeon, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 193 days.

(21) Appl. No.: 16/570,734

(22) Filed: Sep. 13, 2019

(65) Prior Publication Data

US 2020/0152892 A1 May 14, 2020

(30) Foreign Application Priority Data

Nov. 8, 2018 (KR) .......................... 10-2018-0136868

(51) Int. Cl.
| | | |
|---|---|---|
| *H01L 51/00* | (2006.01) | |
| *H01L 27/32* | (2006.01) | |
| *H01L 27/12* | (2006.01) | |
| *H01L 51/52* | (2006.01) | |

(52) U.S. Cl.
CPC ...... *H01L 51/0097* (2013.01); *H01L 27/3248* (2013.01); *H01L 27/3258* (2013.01); *H01L 27/3262* (2013.01); *H01L 27/3276* (2013.01); *H01L 27/124* (2013.01); *H01L 27/1218* (2013.01); *H01L 27/1248* (2013.01); *H01L 27/323* (2013.01); *H01L 51/524* (2013.01); *H01L 51/5281* (2013.01); *H01L 2251/5338* (2013.01)

(58) Field of Classification Search
CPC ............. H01L 27/3272; H01L 51/0097; H01L 27/3248; H01L 27/3258; H01L 27/3262
USPC .......................................................... 257/40
See application file for complete search history.

(56) References Cited

U.S. PATENT DOCUMENTS

| | | | |
|---|---|---|---|
| 2014/0232956 A1* | 8/2014 | Kwon ................. | H01L 27/3276 349/12 |
| 2015/0242029 A1* | 8/2015 | Kim ..................... | G06F 3/03545 345/173 |
| 2016/0218305 A1* | 7/2016 | Kim ................... | G02F 1/133345 |
| 2017/0110526 A1* | 4/2017 | Eo ........................ | H01L 27/3262 |
| 2017/0179215 A1* | 6/2017 | Kwon ................. | H01L 27/3276 |
| 2017/0317299 A1* | 11/2017 | Choi .................. | H01L 27/3276 |
| 2017/0323934 A1* | 11/2017 | Ki ..................... | H01L 29/78672 |

(Continued)

*Primary Examiner* — Dzung Tran

(74) *Attorney, Agent, or Firm* — Birch, Stewart, Kolasch & Birch, LLP

(57) ABSTRACT

A flexible electroluminescent display apparatus can include a flexible substrate including an active area and a bending area extending from the active area; a thin film transistor disposed on the active area and including a semiconductor layer, a gate electrode, a source electrode and a drain electrode; an planarization layer disposed on the thin film transistor; a light emitting element disposed on the planarization layer in the active area and connected to the thin film transistor through a connection electrode; and a first wiring line and a second wiring line disposed in the bending area, in which the first wiring line, the source electrode and the drain electrode are configured as a same layer, and the second wiring line and the connection electrode are configured as a same layer, and the first wiring line and the second wiring line are directly connected to each other.

12 Claims, 6 Drawing Sheets

(56) References Cited

U.S. PATENT DOCUMENTS

2019/0081257 A1* 3/2019 Kim .................... H01L 51/5072
2019/0252412 A1* 8/2019 An ........................ H01L 27/124

* cited by examiner

FLEXIBLE ELECTROLUMINESCENT DISPLAY APPARATUS

CROSS-REFERENCE TO RELATED APPLICATIONS

This application claims the priority of Korean Patent Application No. 10-2018-0136868 filed in the Republic of Korea on Nov. 8, 2018, the disclosure of which is incorporated herein by reference.

BACKGROUND

Field

The present disclosure relates to a flexible electroluminescent display apparatus, and more particularly, to a flexible electroluminescent display apparatus with a minimized bezel area.

Description of the Related Art

As the information age advances, the field of display apparatuses for visually displaying electrical information signals has grown rapidly. Accordingly, various studies on display apparatuses are ongoing to improve the performance, such as thinning, weight lightening, and low power consumption.

Representative display apparatuses may include a Liquid Crystal Display apparatus (LCD), a Field Emission Display apparatus (FED), an Electro-Wetting Display apparatus (EWD), an Organic Light Emitting Display apparatus (OLED), and the like.

Electroluminescent display apparatuses including OLEDs are self-emitting display apparatuses and do not need a separate light source unlike LCDs. Thus, electroluminescent display apparatuses can be manufactured into a lightweight and thin form. Further, the electroluminescent display apparatuses are advantageous in terms of power consumption since they are driven with a low voltage. Also, electroluminescent display apparatuses have excellent color expression ability, a high response speed, a wide viewing angle, and a high contrast ratio (CR). Therefore, electroluminescent display apparatuses are expected to be applied to various fields.

In an electroluminescent display apparatus, an emissive layer (EML) formed of an organic material is disposed between two electrodes, e.g., an anode and a cathode. When holes are injected into the EML from the anode and electrons are injected into the EML from the cathode, the injected electrons and holes are recombined into excitons in the EML and light is emitted from the EML.

The EML contains a host material and a dopant material and the both materials interact with each other. In this situation, the host serves to generate excitons from the electrons and the holes and transmit energy to the dopant. The dopant is a dyeable organic material which is added in a small amount and serves to receive energy from the host to convert the energy into light.

The electroluminescent display apparatus including an EML formed of an organic material is encapsulated using glass, metal or a film to block moisture or oxygen from the outside. Thus, it is possible to suppress oxidation of the EML and the electrodes and protect the electroluminescent display apparatus from a mechanical or physical impact applied from the outside.

SUMMARY

As display apparatuses have been miniaturized, efforts have been made to reduce a bezel area outside an active area (A/A) to increase the size of an effective display area in the same area of the display apparatus.

In the bezel area corresponding to a non-active area (N/A), lines and driving circuits for driving the screen are placed, and, thus, there have been limitations in minimizing the bezel area.

Recently, a flexible electroluminescent display apparatus capable of maintaining display performance even when bent has been under development. The flexible electroluminescent display apparatus uses a flexible substrate formed of a flexible material, such as plastic. In this regard, to minimize a bezel area while securing an area for lines and driving circuits, a technology of minimizing the bezel area by bending a N/A of the flexible substrate behind the active area has been developed and applied.

In the flexible electroluminescent display apparatus using the flexible substrate, such as plastic, it is desirable to suppress defects, such as cracks, caused by bending while securing flexibility of the substrate, various insulating layers disposed on the substrate, and lines formed of metal materials.

Accordingly, the inventors of the present disclosure recognized the above-described problems and invented a flexible electroluminescent display apparatus having a new structure of a bending area (B/A).

The inventors of the present disclosure recognized that as the resolution of an electroluminescent display apparatus increases, a space for lines becomes insufficient. Then, the inventors of the present disclosure invented an electroluminescent display apparatus having a new structure that enables lines to be more freely disposed within a limited space.

Objects of the present disclosure are not limited to the above-mentioned objects, and other objects, which are not mentioned above, can be clearly understood by those skilled in the art from the following descriptions.

According to an aspect of the present disclosure, there is provided a flexible electroluminescent display apparatus. A flexible electroluminescent display apparatus includes a flexible substrate including an active area and a bending area which is extended from one side of the active area and bent. The flexible electroluminescent display apparatus also includes a thin film transistor disposed on the active area and including a semiconductor layer, a gate electrode and a source/drain electrode. The flexible electroluminescent display apparatus further includes a planarization layer disposed on the thin film transistor. The flexible electroluminescent display apparatus also includes a light emitting element disposed on the planarization layer in the active area and connected to the thin film transistor through a connection electrode. The flexible electroluminescent display apparatus further includes a first line and a second line disposed in the bending area. The first line and the source/drain electrode are configured as the same layer, and the second line and the connection electrode are configured as the same layer. The first line and the second line are directly connected to each other.

According to another feature of the present disclosure, there is provided a flexible electroluminescent display apparatus. The flexible electroluminescent display apparatus includes a flexible substrate including an active area and a bending area which is extended from the active area and bent. The flexible electroluminescent display apparatus also includes a planarization layer disposed on the substrate. The flexible electroluminescent display apparatus further includes a first line and a second line disposed in the bending area. The planarization layer is disposed on the first line, the second line is disposed on the planarization layer, and the first line and the second line are directly connected to each other to receive the same signal.

In the electroluminescent display apparatus according to the present disclosure, it is possible to minimize defects of the lines in the bending area of the flexible substrate.

In the electroluminescent display apparatus according to the present disclosure, a size of a bezel area can be minimized by bending the flexible substrate.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
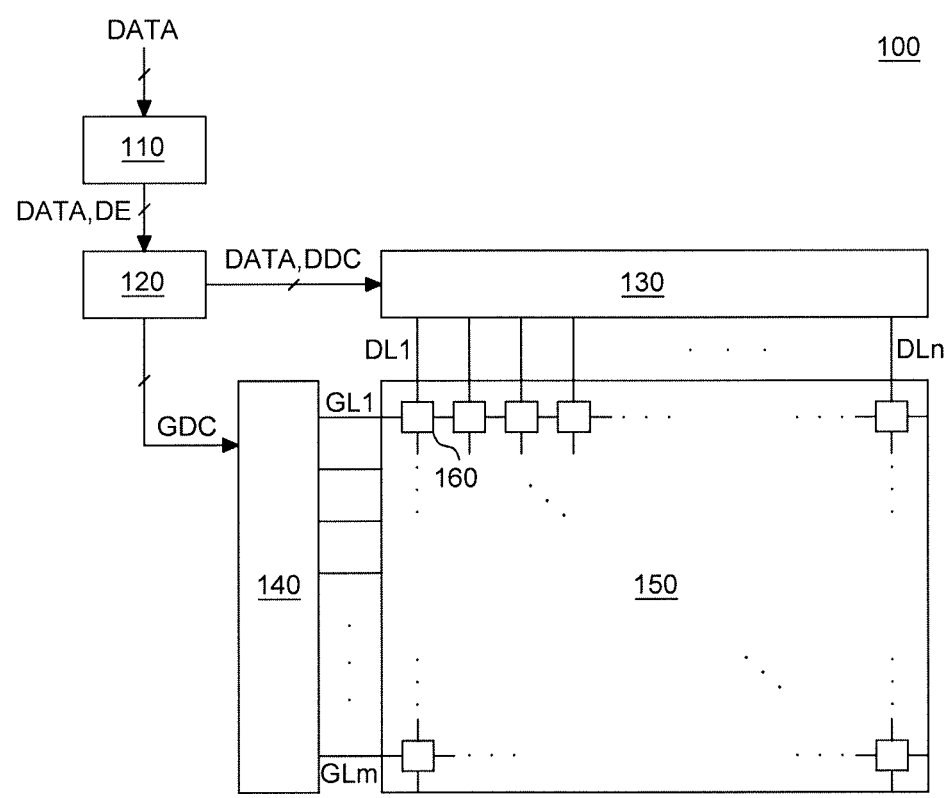
FIG. 1 is a block diagram illustrating an electroluminescent display apparatus according to an embodiment of the present disclosure.

Advantages and characteristics of the present disclosure and a method of achieving the advantages and characteristics will be clear by referring to embodiments described below in detail together with the accompanying drawings. However, the present disclosure is not limited to the example embodiments disclosed herein but will be implemented in various forms. The embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawings are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, an electroluminescent di splay apparatus according to embodiments of the present disclosure will be described in detail with reference to accompanying drawings.

FIG. 1 is a block diagram illustrating an electroluminescent display apparatus according to an embodiment of the present disclosure.

Referring to FIG. 1, a flexible electroluminescent display apparatus 100 includes an image processor 110, a timing controller 120, a data driver 130, a gate driver 140, and a display panel 150.

The image processor 110 outputs a data enable signal DE together with a data signal DATA supplied from the outside. The image processor 110 may output at least one of a vertical synchronization signal, a horizontal synchronization signal, and a clock signal in addition to the data enable signal DE.

The timing controller 120 receives a data signal DATA together with a driving signal including a data enable signal DE or a vertical synchronization signal, a horizontal synchronization signal, and a clock signal from the image processor 110. Then, the timing controller 120 outputs them to the data driver 130. The timing controller 120 outputs a gate timing control signal GDC for controlling operation timing of the gate driver 140 and a data timing control signal DDC for controlling operation timing of the data driver 130 based on the driving signal.

The data driver 130 samples and latches a data signal DATA supplied from the timing controller 120 in response to a data timing control signal DDC supplied from the timing controller 120. Then, the data driver 130 converts and outputs the data signal DATA to a gamma reference voltage. The data driver 130 outputs the data signal DATA through data lines DL1 to DLn.

The gate driver 140 outputs a gate signal while shifting a level of a gate voltage in response to a gate timing control signal GDC supplied from the timing controller 120. The gate driver 140 outputs the gate signal through gate lines GL1 to GLm.

The display panel 150 displays an image as pixels 160 emit light in response to a data signal DATA and a gate signal supplied from the data driver 130 and the gate driver 140. A detailed structure of the pixels 160 will be described with reference to FIG. 2 and FIG. 3.

Figure 2:
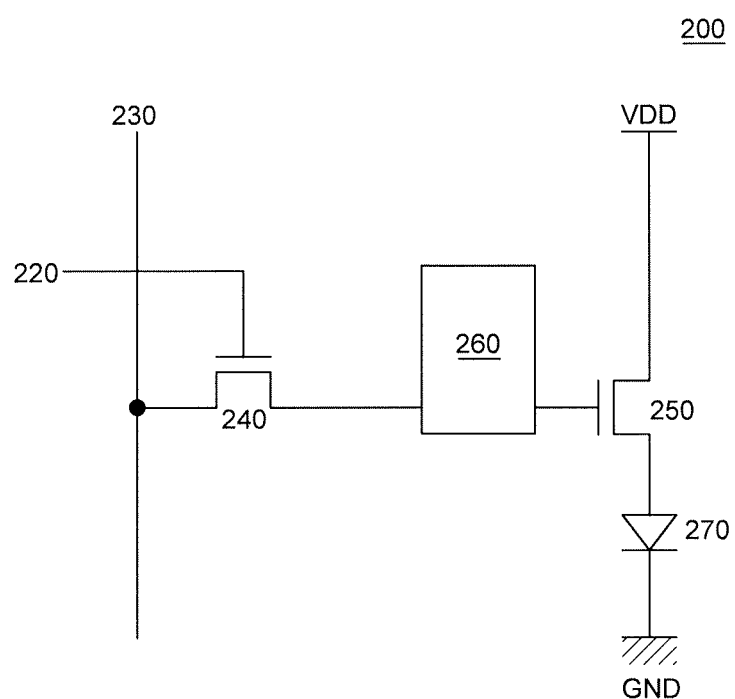
FIG. 2 is a pixel circuit diagram of an electroluminescent display apparatus according to an embodiment of the present disclosure.

FIG. 2 is a pixel circuit diagram of an electroluminescent display apparatus according to an embodiment of the present disclosure.

Referring to FIG. 2, a pixel in an electroluminescent display apparatus 200 according to an embodiment of the present disclosure includes a switching transistor 240, a driving transistor 250, a compensation circuit 260, and a light emitting element 270.

The light emitting element 270 operates to emit light according to a driving current developed by the driving transistor 250.

The switching transistor 240 performs a switching operation. Thus, a data signal supplied through a data line 230 in response to a gate signal supplied through a gate line 220 can be stored as a data voltage in a capacitor of the compensation circuit 260.

The driving transistor 250 operates to allow a constant driving current to flow between a high-potential power supply line VDD and a low-potential power supply line GND according to the data voltage stored in the capacitor.

The compensation circuit 260 is configured to compensate for a threshold voltage of the driving transistor 250. The compensation circuit 260 includes one or more thin film transistors and capacitors. The compensation circuit can have various configurations depending on a compensation method.

Each pixel in the electroluminescent display apparatus 200 has a 2T (Transistor) 1C (Capacitor) structure including the switching transistor 240, the driving transistor 250, the capacitor, and the light emitting element 270. If the compensation circuit 260 is added, the pixel can have various structures, such as 3T1C, 4T2C, 5T2C, 6T1C, 6T2C, 7T1C, 7T2C, and the like.

Figure 3:
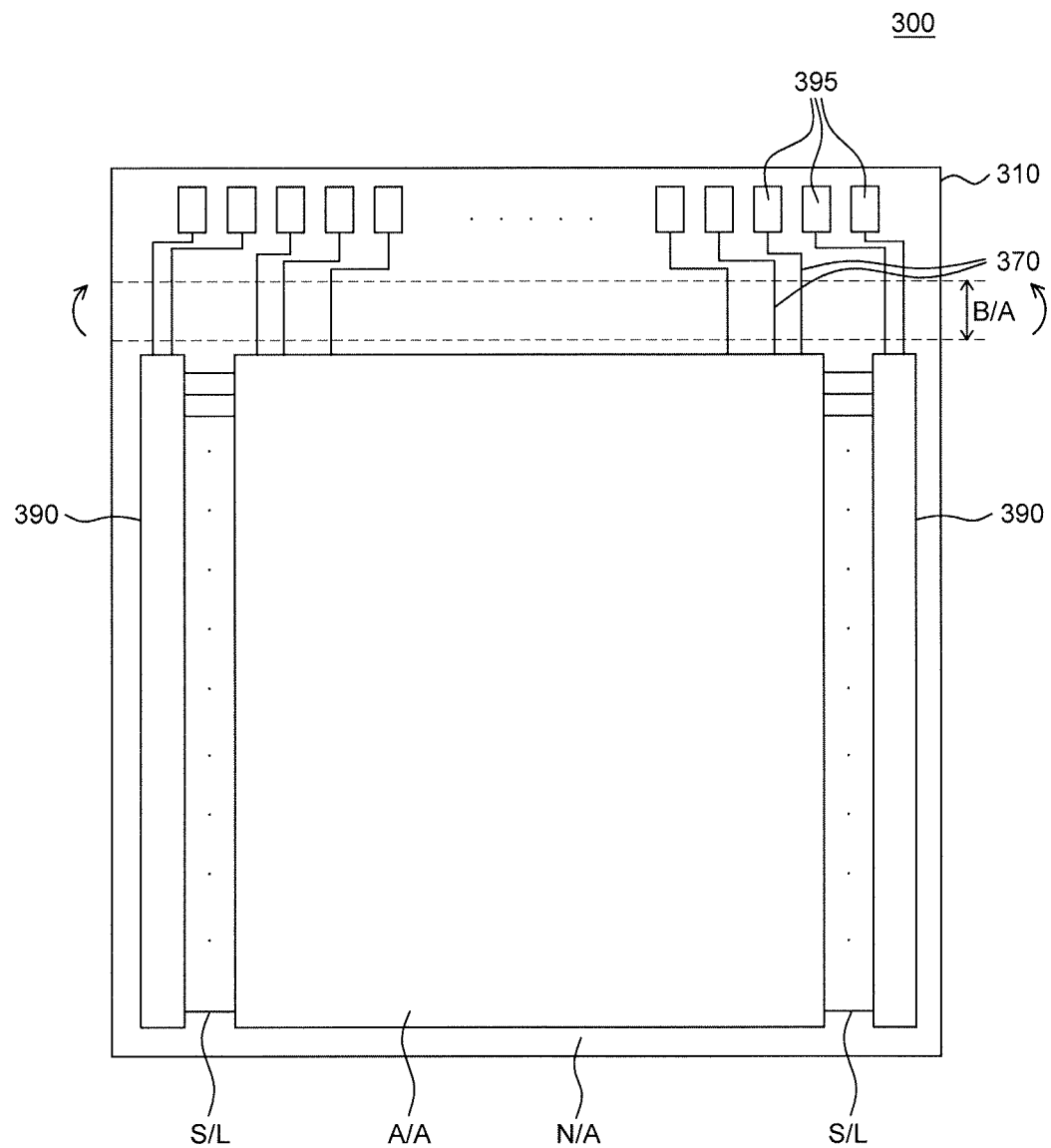
FIG. 3 is a plan view illustrating a flexible substrate of an electroluminescent display apparatus according to an exemplary embodiment of the present disclosure.

FIG. 3 is a plan view illustrating a flexible substrate of an electroluminescent display apparatus according to an embodiment of the present disclosure.

Herein, FIG. 3 illustrates a flexible electroluminescent display apparatus 300 including a flexible substrate 310 being in a non-bending state.

Referring to FIG. 3, the flexible substrate 310 according to an embodiment of the present disclosure includes an active area A/A where pixels are disposed. The pixels emit light using thin film transistors and light emitting elements. The flexible substrate 310 further includes a non-active area N/A surrounding the active area A/A.

In the non-active area N/A of the flexible substrate 310, a circuit such as a gate driver 390 for driving the electroluminescent display apparatus 300 and various signal lines such as a scan line S/L which is a gate line can be disposed. Further, the circuit for driving the electroluminescent display apparatus 300 can be disposed on the flexible substrate 310 using a Gate in Panel (GIP) method. Alternatively, the circuit for driving the electroluminescent display apparatus 300 can be connected to the flexible substrate 310 using a Tape Carrier Package (TCP) or Chip on Film (COF) method.

Pads 395 are disposed on one side of the non-active area N/A of the flexible substrate 310. The pads 395 are formed into a metal pattern to which an external module is bonded.

A part of the non-active area N/A of the flexible substrate 310 can form a bending area B/A by being bent in a direction indicated by an arrow in FIG. 3. In other words, the bending area B/A can be a part of the non-active area N/A extended from one side of the active area A/A.

In the non-active area N/A of the flexible substrate 310, lines and driving circuits for driving the screen are disposed and images are not displayed. Therefore, the non-active area N/A is a non-visible area in an upper surface of the flexible substrate 310. Therefore, by bending a part of the non-active area N/A of the flexible substrate 310, it is possible to minimize a bezel area while securing an area for the lines and driving circuits.

Various lines are disposed on the flexible substrate 310. The lines can be disposed in the active area A/A of the flexible substrate 310 and can also be disposed in the non-active area N/A. In particular, circuit lines 370 disposed in the non-active area N/A can be connected to driving circuits, such as a gate driver or a data driver, and can transfer signals.

The circuit lines 370 can be formed of a conductive material, and can be formed of a highly flexible conductive material to suppress the occurrence of cracks when the flexible substrate 310 is bent. For example, the circuit lines 370 can be formed of a highly flexible conductive material, such as gold (Au), silver (Ag), and aluminum (Al). The circuit lines 370 can be formed of one of various conductive materials used in the active area A/A. The circuit lines 370 can also be formed of molybdenum (Mo), chromium (Cr), titanium (Ti), nickel (Ni), neodymium (Nd), copper (Cu), and an alloy of silver (Ag) and magnesium (Mg). Further, the circuit lines 370 can also have a multilayered structure containing various conductive materials. For example, the circuit lines 370 can have a three-layered structure of titanium (Ti)/aluminum (Al)/titanium (Ti). However, the structure of the circuit lines 370 according to the present disclosure is not limited thereto.

When the circuit lines 370 disposed in the bending area B/A are bent, tensile force is applied thereto. For example, the circuit lines 370 extended on the flexible substrate 310 in the same direction as a bending direction (indicated by an arrow) are applied with the greatest tensile force. Thus, cracks may occur therein. If the cracks are severe, a circuit short may occur. Therefore, the circuit lines 370 are not formed to be extended in the bending direction. Instead, at least some of the circuit lines 370 disposed in the bending area B/A are formed to be extended in a diagonal direction different from the bending direction. Thus, the tensile force applied to the circuit lines 370 can be minimized and spread out over a larger area to minimize the occurrence of cracks.

The circuit lines 370 disposed in the bending area B/A can be formed into various shapes, such as a trapezoidal shape, a triangle-wave shape, a sawtooth wave shape, a sine wave shape, an omega (S)) shape, and a diamond shape.

A detailed cross-sectional structure of the bending area B/A will be described with reference to FIG. 5B.

Figure 4:
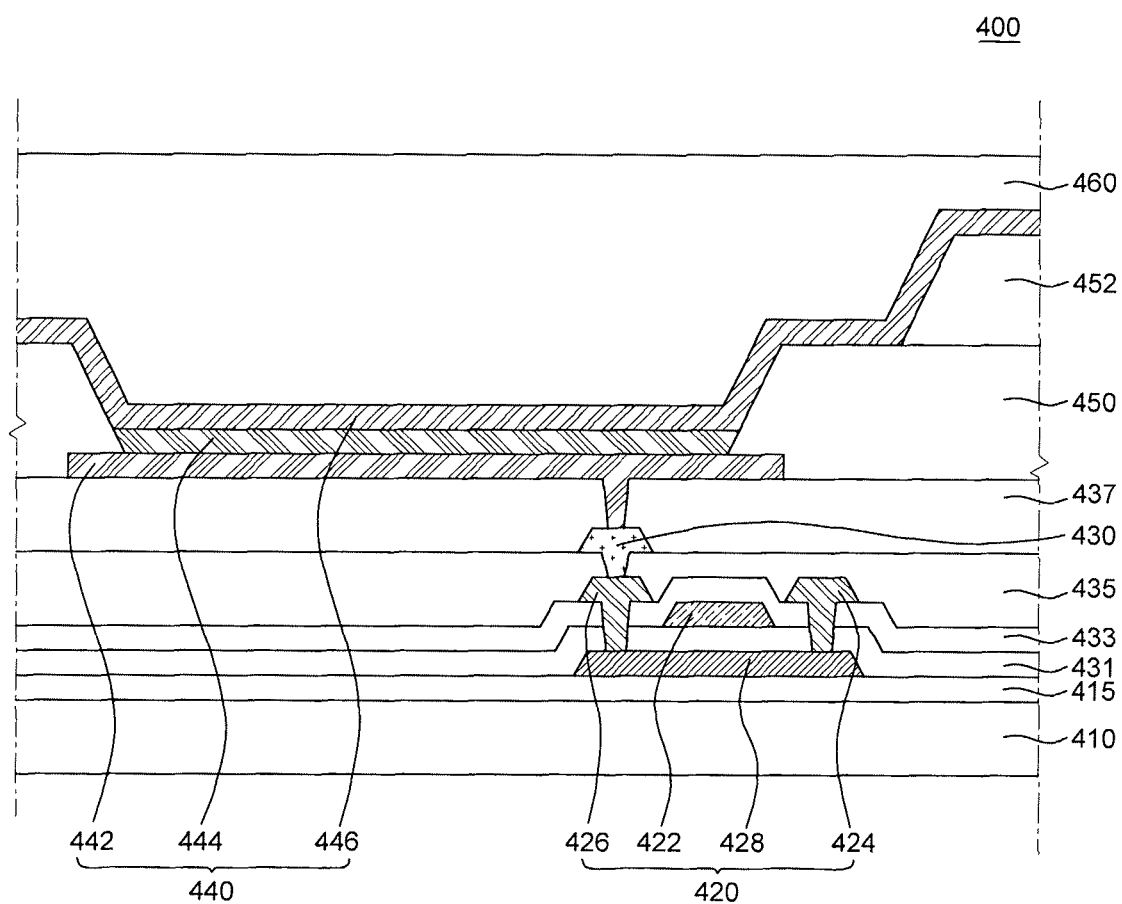
FIG. 4 is a cross-sectional view illustrating an active area of an electroluminescent display apparatus according to an embodiment of the present disclosure.

FIG. 4 is a cross-sectional view illustrating an active area of an electroluminescent display apparatus according to an embodiment of the present disclosure.

Referring to FIG. 4, a substrate 410 serves to support and protect components of an electroluminescent display apparatus 400 which are disposed on the substrate 410. The substrate 410 is formed of a flexible material, and the substrate 410 can be a flexible substrate. For example, the flexible substrate can be formed into a film containing a member selected from the group consisting of a polyester-based polymer, a silicon-based polymer, an acryl-based polymer, a polyolefin-based polymer, and copolymers thereof.

For example, the substrate 410 can contain at least one of polyethylene terephthalate (PET), polybutylene terephthalate (PBT), polysilane, polysiloxane, polysilazane, polycarbosilane, polyacrylate, polymethacrylate, polymethylacrylate, polymethylmetacrylate, polyethylacrylate, polyethylmetacrylate, a cyclic olefin copolymer (COC), a cyclic olefin polymer (COP), polyethylene (PE), polypropylene (PP), polyimide (PI), polymethylmethacrylate (PMMA), polystyrene (PS), polyacetal (POM), polyether ether ketone (PEEK), polyethersulfone (PES), polytetrafluoroethylene (PTFE), polyvinyl chloride (PVC), polycarbonate (PC), polyvinylidene fluoride (PVDF), a perfluoroalkyl polymer (PFA), a styrene acrylonitrile copolymer (SAN), and combinations thereof.

A buffer layer 415 can be further disposed on the substrate 410. The buffer layer 415 may suppress the permeation of moisture or other impurities through the substrate 410 and flatten the surface of the substrate 410. The buffer layer 415 may not be provided depending on the kind of the substrate 410 or the kind of a thin film transistor 420 disposed on the substrate 410.

The thin film transistor 420 disposed on the substrate 410 includes a gate electrode 422, a source electrode 424, a drain electrode 426, and a semiconductor layer 428.

The semiconductor layer 428 can be formed of amorphous silicon. Alternatively, the semiconductor layer 428 can be formed of polycrystalline silicon which has higher mobility than amorphous silicon and thus has low power consumption and high reliability and can be applied to a driving thin film transistor in a pixel. However, the present disclosure is not limited thereto.

Further, the semiconductor layer 428 can be formed of an oxide semiconductor. The oxide semiconductor has excellent mobility and uniformity. The oxide semiconductor forming the semiconductor layer 428 can include: for example, a quaternary metal oxide, such as an indium tin gallium zinc oxide (InSnGaZnO)-based material; a ternary metal oxide, such as an indium gallium zinc oxide (InGaZnO)-based material, an indium tin zinc oxide (InSnZnO)-based material, an indium aluminum zinc oxide (InAlZnO)-based material, a tin gallium zinc oxide (SnGaZnO)-based material, an aluminum gallium zinc oxide (AlGaZnO)-based material, and a tin aluminum zinc oxide (SnAlZnO)-based material; and a binary metal oxide such as an indium zinc oxide (InZnO)-based material, a tin zinc oxide (SnZnO)-based material, an aluminum zinc oxide (AlZnO)-based material, a zinc magnesium oxide (ZnMgO)-based material, a tin magnesium oxide (SnMgO)-based material, an indium magnesium oxide (InMgO)-based material, an indium gallium oxide (InGaO)-based material, an indium oxide (InO)-based material, a tin oxide (SnO)-based material, and a zinc oxide (ZnO)-based material. Composition ratios of the elements included in the respective oxide semiconductors are not particularly limited.

The semiconductor layer 428 can include a source region containing a p-type or n-type impurity, a drain region, and a channel between the source region and the drain region. The semiconductor layer 428 can also include a low-concentration doping region between the source region and the drain region adjacent to the channel.

The source region and the drain region are doped with an impurity at a high concentration and respectively connected to the source electrode 424 and the drain electrode 426 of the thin film transistor 420. As impurity ions, a p-type impurity or n-type impurity can be used. The p-type impurity can be, for example, one of boron (B), aluminum (Al), gallium (Ga), and indium (In) and the n-type impurity can be, for example, one of phosphorous (P), arsenic (As), and antimony (Sb).

In the semiconductor layer 428, the channel region can be doped with the n-type impurity or the p-type impurity depending on the structure of an NMOS or a PMOS thin film transistor. The thin film transistor included in the electroluminescent display apparatus according to an embodiment of the present disclosure can be the NMOS or PMOS thin film transistor.

A first insulating layer 431 is a single layer of silicon oxide (SiOx) or silicon nitride (SiNx), or a multilayer thereof and disposed such that a current flowing in the semiconductor layer 428 does not flow into the gate electrode 422. Further, silicon oxide is less flexible than metal but more flexible than silicon nitride and can be formed into a single layer or a multilayer depending on its characteristics.

The gate electrode 422 serves as a switch to turn on or turn off the thin film transistor 420 based on an electrical signal transferred from the outside through a gate line. The gate electrode 422 can be formed as a single layer or a multilayer of, e.g., a conductive metal, such as copper (Cu), aluminum (Al), molybdenum (Mo), chromium (Cr), gold (Au), titanium (Ti), nickel (Ni), and neodymium (Nd) or an alloy thereof. The present disclosure is not limited thereto.

The source electrode 424 and the drain electrode 426 are connected to data lines and allow an electrical signal transferred from the outside to be transferred to a light emitting element 440 from the thin film transistor 420. The source electrode 424 and the drain electrode 426 can be formed as a single layer or a multilayer of, e.g., a conductive metal, such as copper (Cu), aluminum (Al), molybdenum (Mo), chromium (Cr), gold (Au), titanium (Ti), nickel (Ni), and neodymium (Nd) or an alloy thereof. The present disclosure is not limited thereto.

A second insulating layer 433 can be formed as a single layer or a multilayer of silicon oxide (SiOx) or silicon nitride (SiNx). The second insulating layer 433 can be disposed between the gate electrode 422 and the source and drain electrodes 424 and 426 to insulate the gate electrode 422 from the source and drain electrodes 424 and 426.

A passivation layer formed as an inorganic insulating layer of silicon oxide (SiOx) or silicon nitride (SiNx) can be further disposed on the thin film transistor 420. The passivation layer can serve to block unnecessary electrical connection between the components on and under the passivation layer and suppress contamination or damage from the outside. The passivation layer may not be provided depending on the configurations and characteristics of the thin film transistor 420 and the light emitting element 440.

The thin film transistor 420 can be classified into an inverted-staggered structure or a coplanar structure depending on the positions of the components constituting the thin film transistor 420. In a thin film transistor having the inverted-staggered structure, a gate electrode is positioned opposite to a source electrode and a drain electrode based on a semiconductor layer. In the thin film transistor 420 having the coplanar structure, the gate electrode 422 is positioned on the same side as the source electrode 424 and the drain electrode 426 based on the semiconductor layer 428 as shown in FIG. 4.

FIG. 4 illustrates the thin film transistor 420 having the coplanar structure. However, the electroluminescent display apparatus 400 according to the present disclosure is not limited thereto, and can also include a thin film transistor having the inverted-staggered structure.

For convenience of description, FIG. 4 illustrates only a driving thin film transistor among various thin film transistors which can be included in the electroluminescent display apparatus 400. However, a switching thin film transistor, a capacitor, and the like can also be included in the electroluminescent display apparatus 400. Further, when the switching thin film transistor is applied with a signal from a gate line, it transfers a signal from a data line to a gate electrode of a driving thin film transistor. The driving thin film transistor transfers a current transferred through a power supply line to an anode 442 in response to the signal transferred from the switching thin film transistor. Further, the driving thin film transistor controls the light emission with the current transferred to the anode 442.

To protect the thin film transistor 420 and reduce a step difference caused by the thin film transistor 420 and a parasitic-capacitance between the thin film transistor 420 and the gate and data lines with the light emitting elements 440, planarization layers 435 and 437 are disposed on the thin film transistor 420.

The planarization layers 435 and 437 can be formed of, e.g., one or more materials of acrylic resin, epoxy resin, phenolic resin, polyamides resin, polyimides resin, unsaturated polyesters resin, polyphenylene resin, polyphenylene-sulfides resin, and benzocyclobutene. However, the present disclosure is not limited thereto.

The electroluminescent display apparatus 400 according to an embodiment of the present disclosure can also include a first planarization layer 435 and a second planarization layer 437 included in a plurality of planarization layers 435 and 437 laminated in sequence.

For example, the first planarization layer 435 can be disposed on the thin film transistor 420 and the second planarization layer 437 can be disposed on the first planarization layer 435.

Further, a buffer layer can also be disposed on the first planarization layer 435. The buffer layer can be disposed to protect the components disposed on the first planarization layer 435. The buffer layer can be formed as a single layer of silicon oxide (SiOx) or silicon nitride (SiNx) or as a multilayer of silicon oxide (SiOx) or silicon nitride (SiNx). The buffer layer may not be provided depending on the configurations and characteristics of the thin film transistor 420 and the light emitting element 440.

An intermediate electrode 430 is disposed through a contact hole formed in the first planarization layer 435 and electrically connected to the thin film transistor 420.

A passivation layer formed as an inorganic insulating layer of silicon oxide (SiOx) or silicon nitride (SiNx) can be further disposed on the first planarization layer 435 and the intermediate electrode 430. The passivation layer can serve to block unnecessary electrical connection between the components and suppress contamination or damage from the outside. The passivation layer may not be provided depending on the configurations and characteristics of the thin film transistor 420 and the light emitting element 440

The light emitting element 440 is disposed on the second planarization layer 437 and includes the anode 442, a light emitting unit 444, and a cathode 446.

The anode 442 can be disposed on the second planarization layer 437. The anode 442 serves to supply holes to the light emitting unit 444 and is connected to the intermediate electrode 430 through a contact hole formed in the second planarization layer 437. Further, the anode 442 is electrically connected to the thin film transistor 420 through the intermediate electrode 430.

The anode 442 can be formed of, e.g., a transparent conductive material, such as indium tin oxide (ITO), indium zinc oxide (IZO), or the like, but is not limited thereto.

If the electroluminescent display apparatus 400 according to the present disclosure is a top emission type in which light is emitted to the upper side of the cathode 446, the anode 442 can further include a reflective layer. The reflective layer enables the emitted light to be reflected from the anode 442 and more easily emitted to the upper side of the cathode 446.

For example, the anode 442 can have a two-layered structure in which a transparent conductive layer formed of a transparent conductive material and a reflective layer are laminated in sequence. The anode 442 can have a three-layered structure in which a transparent conductive layer, a reflective layer, and a transparent conductive layer are laminated in sequence. Herein, the reflective layer can be formed of silver (Ag) or an alloy containing Ag.

A bank 450 is disposed on the anode 442 and the second planarization layer 437. The bank 450 can define each pixel by dividing a region that emits light. The bank 450 can be formed by forming a photoresist on the anode 442 and then performing photolithography to the photoresist. A photoresist is a photosensitive resin which is changed in solubility to a developer by the action of light. It is possible to obtain a specific pattern by performing exposure and development to the photoresist. The photoresist can be classified into a positive photoresist and a negative photoresist. With the positive photoresist, a light exposure part is increased in solubility to a developer by exposure to light. When the positive photoresist is developed, a pattern from which the light exposure part is removed can be obtained. Further, with the negative photoresist, a light exposure part is greatly decreased in solubility to a developer by exposure to light. When the negative photoresist is developed, a pattern from which a non-light exposure part is removed can be obtained.

A fine metal mask (FMM) which is a deposition mask can be used to form the light emitting unit 444 of the light emitting element 440. Further, a spacer 452 formed of one of transparent organic materials, such as polyimide, photoacryl, and benzocyclobutene (BCB) can be disposed on the bank 450. The spacer 452 can be provided to suppress damage caused by contact between the bank 450 and the deposition mask disposed on the bank 450 and maintain a constant distance between the bank 450 and the deposition mask.

The light emitting unit 444 is disposed between the anode 442 and the cathode 446. The light emitting unit 444 serves to emit light. The light emitting unit 444 can include at least one of a hole injection layer (HIL), a hole transport layer (HTL), an emitting layer (EML), an electron transport layer (ETL), and an electron injection layer (EIL). Some of the components of the light emitting unit 444 may not be provided depending on the configuration or characteristics of the electroluminescent display apparatus 400. Herein, an electroluminescent layer and an inorganic emitting layer can be applied to the EML.

The HIL is disposed on the anode 442 to enable easy injection of holes. The HIL can be formed of, e.g., any one or more of HAT-CN(dipyrazino[2,3-f:2',3'-h]quinoxaline-2,3,6,7,10.11-hexacarbonitrile), CuPc(phthalocyanine), and NPD(N,N'-bis(naphthalene-1-yl)-N,N'-bis(phenyl)-2,2'-dimethylbenzidine).

The HTL is disposed on the HIL to enable easy transport of holes into the EML. The HTL can be formed of, e.g., any one or more of NPD(N,N'-bis(naphthalene-1-yl)-N,N'-bis(phenyl)-2,2'-dimethylbenzidine), TPD(N,N'-bis-(3-methylphenyl)-N,N'-bi s-(phenyl)-benzidine), s-TAD(2,2',7,7'- tetrakis(N,N-dimethylamino)-9,9-spirofluorene), and MTDATA(4,4',4"-Tris(N-3-methylphenyl-N-phenyl-amino)-triphenylamine).

The EML is disposed on the HTL and contains a luminescent material that emits light of a specific color. Thus, the EML can emit light of a specific color. Further, the luminescent material can be formed using a phosphorescent material or fluorescent material.

When the EML emits red light, a peak wavelength can be in the range of 600 nm to 650 nm. The EML can be formed of a phosphorescent material containing a host material including CBP(4,4'-bis(carbazol-9-yl)biphenyl) or mCP(1,3-bis(carbazol-9-yl)benzene) and one or more dopants including PIQIr(acac)(bis(1-phenylisoquinoline)(acetylacetonate) iridium), PQIr(acac)(bis(1-phenylquinoline)(acetylacetonate) iridium), PQIr(tris(1-phenylquinoline) iridium), and PtOEP(octaethylporphyrin platinum). Alternatively, the EML can be formed of a fluorescent material including PBD:Eu(DBM)3(Phen) or perylene.

Herein, a peak wavelength (λmax) refers to the maximum wavelength of electroluminescence (EL). The wavelength at which the light emitting layers of the light emitting unit emit their own light refers to photoluminescence (PL). The light which is emitted under the effect of the thickness or optical characteristics of each of the light emitting layers refers to emittance. Herein, electroluminescence (EL) refers to light which is finally emitted by the electroluminescent display apparatus and can be expressed as a multiplication of photoluminescence (PL) and emittance.

When the EML emits green light, a peak wavelength can be in the range of 520 nm to 540 nm. The EML can be formed of a phosphorescent material containing a host material including CBP or mCP and a dopant material, such as an Ir complex including Ir(ppy)$_3$(tris(2-phenylpyridine) iridium). Alternatively, the EML can be formed of a fluorescent material including Alq$_3$(tris(8-hydroxyquinolino) aluminum).

When the EML emits blue light, a peak wavelength can be in the range of 440 nm to 480 nm. The EML can be formed of a phosphorescent material containing a host material including CBP or mCP and a dopant material including FIrPic(bis(3,5-difluoro-2-(2-pyridyl)phenyl-(2-carboxypyridyl)iridium). Alternatively, the EML can be formed of a fluorescent material including any one of spiro-DPVBi(4,4'-Bis(2,2-diphenyl-ethen-1-yl)biphenyl), DSA(1-4-di-[4-(N,N-di-phenyl)amino]styryl-benzene), a PFO(polyfluorene)-based polymer, and a PPV(polyphenylenevinylene)-based polymer.

The ETL is disposed on the EML to enable easy transport of electrons into the EML. The ETL can be formed of, e.g., any one or more of Liq(8-hydroxyquinolinolato-lithium), PBD(2-(4-biphenyl)-5-(4-tert-butylphenyl)-1,3,4-oxadiazole), TAZ(3-(4-biphenyl)4-phenyl-5-tert-butylphenyl-1,2,4-triazole), spiro-PBD, BCP(2,9-Dimethyl-4,7-diphenyl-1,10-phenanthroline), and BAlq(bis(2-methyl-8-quinolinolate)-4-(phenylphenolato)aluminum).

The EIL can be further disposed on the ETL. The EIL is an organic layer that enables easy injection of electrons from the cathode 446. The EIL may not be provided depending on the configuration and characteristics of the electroluminescent display apparatus 400. The EIL can be formed of an inorganic metal compound, such as BaF$_2$, LiF, NaCl, CsF, Li$_2$O, and BaO, or any one or more organic compounds selected from HAT-CN(dipyrazino[2,3-f:2',3'-h]quinoxaline-2,3,6,7,10.11-hexacarbonitrile), CuPc(phthalocyanine), and NPD(N,N'-bis(naphthalene-1-yl)-N,N'-bis(phenyl)-2,2'-dimethylbenzidine).

An electron blocking layer or a hole blocking layer that blocks the flow of holes or electrons can be further disposed adjacent to the EML. Each of the electron blocking layer and the hole blocking layer can improve the luminous efficiency by suppressing the passage of electrons from the EML through the adjacent HTL when the electrons are injected into the EML or the passage of holes from the EML through the adjacent ETL when the holes are injected into the EML.

The cathode 446 is disposed on the light emitting unit 444 and serves to supply electrons to the light emitting unit 444. The cathode 446 should supply electrons and thus can be formed of a metal material, such as magnesium (Mg) or silver-magnesium (Ag—Mg) which is a conductive material having a low work function, but is not limited thereto.

If the electroluminescent display apparatus 400 is a top emission type, the cathode 446 can be formed of a transparent conductive oxide based on indium tin oxide (ITO), indium zinc oxide (IZO), indium tin zinc oxide (ITZO), zinc oxide (ZnO), and tin oxide (TiO).

An encapsulation unit 460 can be disposed on the light emitting element 440. The encapsulation unit 460 can serve to suppress oxidation or damage to the thin film transistor 420 and the light emitting element 440, which are components of the electroluminescent display apparatus 400, caused by moisture, oxygen, or impurities introduced from the outside. The encapsulation unit 460 can include a plurality of encapsulation layers, a particle cover layer, and a plurality of barrier films laminated in sequence.

The encapsulation layers are disposed on the entire upper surface of the thin film transistor 420 and the light emitting element 440. The encapsulation layers can be formed of one of silicon nitride (SiNx) or aluminum oxide (AlyOz) which are inorganic materials, but are not limited thereto.

The particle cover layer is disposed on the encapsulation layers, and the encapsulation layers can be further disposed on the particle cover layer.

The particle cover layer can be formed of, e.g., silicon oxycarbon (SiOCz)-, acryl-, or epoxy-based resin which are organic materials, but is not limited thereto. The particle cover layer can provide compensation by covering curves and impurities by defects generated due to cracks generated by impurities or particles during the processes.

The barrier film can be further disposed on the encapsulation layers and the particle cover layer. The barrier film can retard the permeation of oxygen and moisture from the outside. The barrier film is formed as a transparent double-sided adhesive film. The barrier film can be formed of, e.g., any one of olefin-, acryl-, and silicon-based insulating materials. Alternatively, a barrier film formed of any one of a cycloolefin polymer (COP), a cycloolefin copolymer (COC), and polycarbonate (PC) can be further laminated. However, the present disclosure is not limited thereto.

Figure 5A:
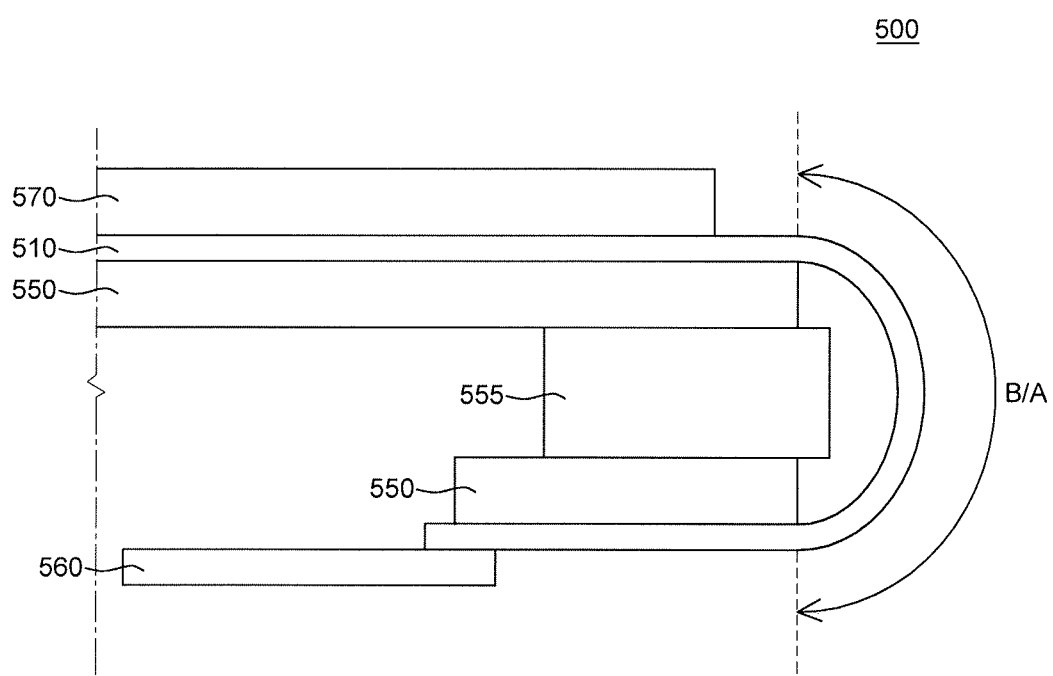
FIG. 5A and FIG. 5B are a cross-sectional view and an enlarged view, respectively, illustrating a bending area of an electroluminescent display apparatus according to an embodiment of the present disclosure.

FIG. 5A is a cross-sectional view illustrating a bending area of an electroluminescent display apparatus according to an embodiment of the present disclosure.

Some of the components illustrated in FIG. 5A are substantially identical/similar to those illustrated in FIG. 3. A detailed description thereof will be omitted.

Referring to FIG. 5A, a touch screen panel, a polarizing plate, and a cover glass 570 can be laminated on a flexible substrate 510.

The touch screen panel is fixed using an adhesive layer. Herein, the adhesive layer can be formed of an optically cleared resin (OCR) or optically cleared film (OCA film), but is not limited thereto.

Recently, a touch screen panel has been used as an input means for a display apparatus instead of a mouse or keyboard. The touch screen panel enables a user to directly input information on the screen of the display apparatus with a finger or pen. The application of a display apparatus equipped with the touch screen panel has been increasingly applied various fields.

The touch screen panel converts a contact position that the user's finger or the object directly touches into an electrical signal, and receives the content selected at the contact position as an input signal.

The touch screen panel can be a mutual-capacitance type in which a plurality of touch driving electrodes and a plurality of touch sensing electrodes intersect each other, but is not limited thereto. The touch screen panel can also be a self-capacitance type. In the self-capacitance type touch screen panel, only a plurality of touch sensing electrodes is disposed. In addition, the touch screen panel can be implemented as various types, such as a resistive type or electromagnetic type.

A polarizing plate can be disposed on the touch screen panel. The polarizing plate suppresses the reflection of external light on an active area A/A of the flexible substrate 510. External natural light may be introduced and reflected by a reflecting plate included in an anode of a light emitting element or an electrode formed of metal under the light emitting element. Thus, displayed images may not be seen due to the reflected light. To reduce the reflection of external light, the polarizing plate polarizes light, which is introduced from the outside, in a specific direction and suppresses the emission of reflected light to the outside of an electroluminescent display apparatus 500.

The cover glass 570 is disposed on the touch screen panel or polarizing plate to protect the outer surface of the electroluminescent display apparatus 500.

A backplate 550 is disposed under the flexible substrate 510. If the flexible substrate 510 is formed of a plastic material such as polyimide, the electroluminescent display apparatus 500 is manufactured in a state where a support board formed of glass is disposed under the flexible substrate 510. After the manufacturing process is finished, the support board can be separated and released.

Even after the support board is released, a component for supporting the flexible substrate 510 is used. Therefore, the backplate 550 for supporting the flexible substrate 510 can be disposed under the flexible substrate 510.

The backplate 550 can be disposed in the other areas of the flexible substrate 510 except a bending area B/A to be adjacent to the bending area B/A. The backplate 550 can be formed as a plastic thin film formed of, e.g., polyimide, polyethylene naphthalate (PEN), polyethylene terephthalate (PET), polymers, and combinations thereof.

A support member 555 can be disposed between the two backplates 550. The support member 555 can be bonded to the backplates 550. The support member 555 can be formed of plastic materials, such as polycarbonate (PC), polyimide (PI), polyethylene naphthalate (PEN), polyethylene terephthalate (PET), polymers, and combinations of the polymers. The rigidity of the support member 555 formed of plastic materials can be controlled by adding additives for increasing the thickness and rigidity of the support member 555. Further, the support member 555 can be formed of glass, ceramic, metal, or other rigid materials or combinations of the above-described materials.

An insulating film 560 is connected to an end of the flexible substrate 510. Various lines are formed on the insulating film 560 to transfer signals to pixels disposed on the active area A/A. The insulating film 560 is formed of a flexible material and thus can be bent. A driving element can be mounted on the insulating film 560. The driving element forms a driving package such as a Chip on Film (COF) together with the insulating film 560. The driving element is connected with the lines formed on the insulating film 560 to send driving signals and data to the pixels disposed in the active area A/A.

A circuit board connected to the insulating film 560 receives image signals from the outside and applies various signals to the pixels disposed in the active area A/A. The circuit board can be a printed circuit board.

A micro-coating layer can be disposed on the bending area B/A of the flexible substrate 510. During bending, lines disposed on the flexible substrate 510 may be applied with tensile force, and, thus, micro-cracks may occur. Thus, the micro-coating layer can be coated to a small thickness where the lines are bent to protect the lines. Herein, the micro-coating layer can be formed of resin, such as an acryl-based material or urethane acrylate, but is not limited thereto.

The micro-coating layer can regulate a neutral plane of the bending area B/A. The neutral plane refers to a virtual plane where compressive force and tensile force applied to a structure cancel each other out, and, thus, stress is not applied. If two or more structures are laminated, a virtual neutral plane can exist between the structures. If all the structures are bent in one direction, the structures disposed in the bending direction based on the neutral plane are compressed by bending and thus applied with compressive force. In contrast, the structures disposed opposite to the bending direction based on the neutral plan are stretched by bending and thus applied with tensile force. In general, the structures become weaker when applied with tensile force than when applied with compressive force with the same intensity as the tensile force. Thus, the possibility of the occurrence of cracks is higher when the structures are applied with tensile force.

The flexible substrate 510 disposed under the neutral plane may be compressed and thus applied with compressive force and the lines disposed on the neutral plane may be applied with tensile force. Thus, cracks may occur due to the tensile force. Therefore, the micro-coating layer can be positioned on the neutral plane to minimize the tensile force applied to the lines.

Since the micro-coating layer is disposed on the bending area B/A, the neutral plane can be moved upwards (e.g., shifted). Thus, the lines can be disposed at a position equal to or higher than the neutral plane. Therefore, the lines may not be applied with stress or may be applied with compressive force during bending. Thus, it is possible to suppress the occurrence of cracks.

A detailed plane structure of the bending area B/A will be described with reference to FIG. 5B.

Figure 5B:
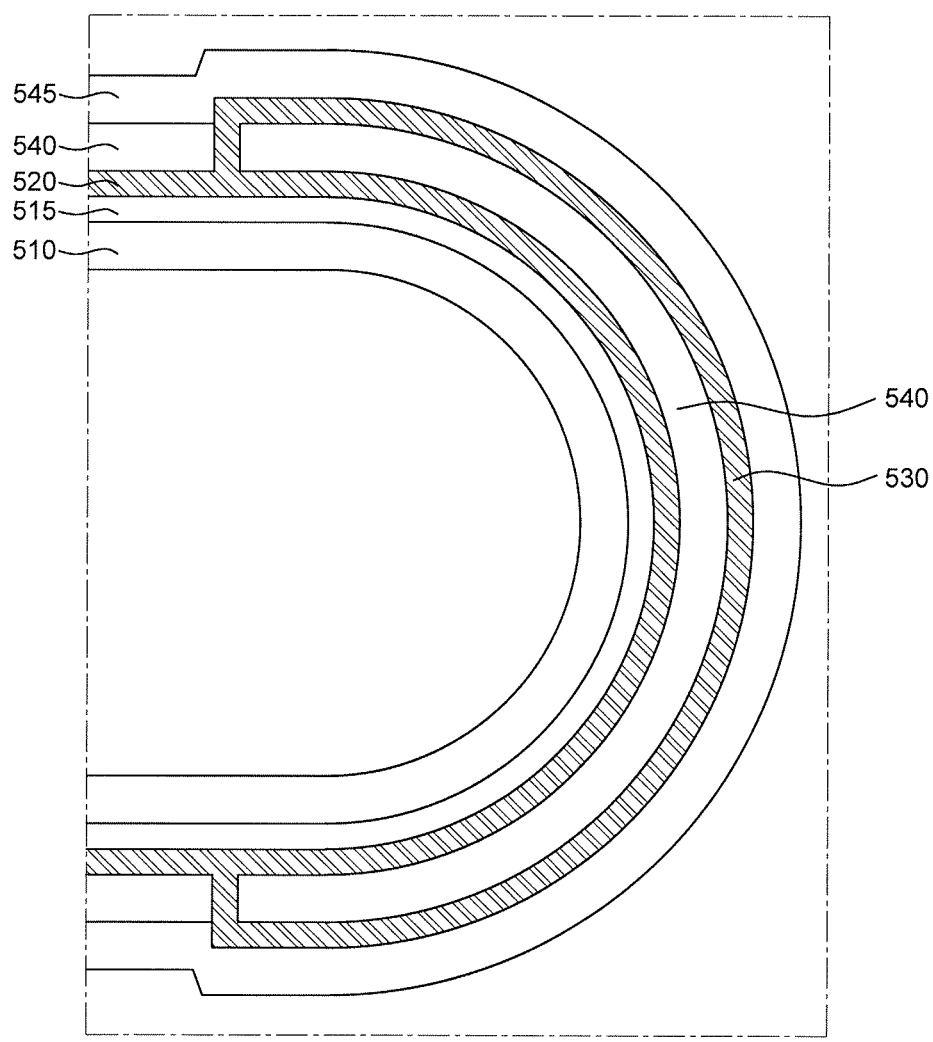

FIG. 5B is an enlarged view illustrating a bending area of an electroluminescent display apparatus according to an embodiment of the present disclosure.

Some of the components illustrated in FIG. 5B are substantially identical/similar to those illustrated in FIG. 4 and FIG. 5A. A detailed description thereof will be omitted.

The gate signal and data signal described above with reference to FIG. 1 through FIG. 3 are input from the outside and transferred to the pixels disposed in the active area A/A through circuit lines disposed in a non-active area N/A of the electroluminescent display apparatus 500. Thus, the pixels emit light. Also, if one of the circuit lines disposed in the bending area B/A is used to transfer a signal and cracks occurs in the line, the signal may not be transferred properly.

While the flexible substrate 510 is bent, cracks may occur in the lines. Even when cracks occur in other components disposed on another layer, the cracks may spread to the lines. If cracks occur in the lines as such, signals may not be transferred.

Accordingly, the lines disposed in the bending area B/A of the electroluminescent display apparatus 500 according to an embodiment of the present disclosure can be disposed as a dual line including a first wiring line 520 and a second wiring line 530 (e.g., a double layered line).

The first wiring line 520 and the second wiring line 530 can be formed of a conductive material. More specifically, the first line 520 and the second wiring line 530 can be formed of a conductive material having excellent flexibility to reduce the occurrence of cracks while the flexible substrate 510 is bent. The first line 520 and the second wiring line 530 can be formed of a conductive material having excellent flexibility such as gold (Au), silver (Ag), aluminum (Al), and the like. Alternatively, the first wiring line 520 and the second wiring line 530 can be formed of one of various conductive materials used in the active area A/A and can be formed of molybdenum (Mo), chromium (Cr), titanium (Ti), nickel (Ni), neodymium (Nd), copper (Cu), and an alloy of silver (Ag) and magnesium (Mg). The first wiring line 520 and the second wiring line 530 can have a multi-layered structure containing various conductive materials. For example, the first wiring line 520 and the second wiring line 530 can have a three-layered structure of titanium (Ti)/aluminum (Al)/titanium (Ti), but are not limited thereto.

A buffer layer 515 is disposed on the flexible substrate 510 in the same manner as described above with reference to FIG. 4. In this situation, a protection layer formed as an inorganic insulating layer including the buffer layer 515 is disposed adjacent to the first wiring line 520 and the second wiring line 530 to protect the first wiring line 520 and the second wiring line 530. Thus, it is possible to suppress corrosion of the first wiring line 520 and the second wiring line 530 which may occur when the first wiring line 520 and the second wiring line 530 react with moisture.

When the first wiring line 520 and the second wiring line 530 formed in the bending area B/A are bent, tensile force is applied thereto. As described above with reference to FIG. 3, the lines extended on the flexible substrate 510 in the same direction as a bending direction are applied with the greatest tensile force. Thus, cracks may occur therein. If the cracks are severe, a circuit short may occur. Therefore, the lines are not formed to be extended in the bending direction. Instead, at least some of the lines disposed in the bending area B/A are formed to be extended in a diagonal direction different from the bending direction. Thus, tensile force applied to the lines can be minimized to reduce the occurrence of cracks. The lines can be formed into a diamond shape, a triangle-wave shape, a sine wave shape, a trapezoidal shape, or the like, but is not limited thereto.

As described above with reference to FIG. 4, a first planarization layer 540 is disposed on the first wiring line 520. The second wiring line 530 is disposed on the first planarization layer 540, and a second planarization layer 545 is disposed on the second wiring line 530.

The first planarization layer 540 and the second planarization layer 545 can be formed of, e.g., one or more materials of acrylic resin, epoxy resin, phenolic resin, polyamides resin, polyimides resin, unsaturated polyesters resin, polyphenylene resin, polyphenylenesulfides resin, and benzocyclobutene. However, the present disclosure is not limited thereto.

A contact hole is formed in the first planarization layer 540 to connect the first wiring line 520 and the second wiring line 530, and, thus, the first wiring line 520 and the second wiring line 530 can transfer the same signal at the same time. Also, the contact hole can be located at boundary of the bending area and also at this area a single wire can transition into a double layer wire (520 and 530) at the boundary of the bending area (e.g., see FIG. 5B). Thus, even if cracks occur on an upper surface or a lower substrate and spread to the surroundings and affect one of the first wiring line 520 and the second wiring line 530, the non-affected first wiring line 520 or second wiring line 530 can normally transfer a signal. Therefore, the occurrence of defects can be suppressed and the display apparatus 500 can be driven normally.

The embodiments of the present disclosure can also be described as follows:

According to an aspect of the present disclosure, there is provided a flexible electroluminescent display apparatus. The flexible electroluminescent display apparatus includes a flexible substrate including an active area and a bending area which is extended from one side of the active area and bent. The flexible electroluminescent display apparatus also includes a thin film transistor disposed on the active area and including a semiconductor layer, a gate electrode and a source/drain electrode. The flexible electroluminescent display apparatus further includes a planarization layer disposed on the thin film transistor. The flexible electroluminescent display apparatus also includes a light emitting element disposed on the planarization layer in the active area and connected to the thin film transistor through a connection electrode. The flexible electroluminescent display apparatus further includes a first wiring line and a second wiring line disposed in the bending area. The first wiring line and the source/drain electrode are configured as the same layer, and the second wiring line and the connection electrode are configured as the same layer. The first wiring line and the second wiring line are directly connected to each other.

The planarization layer includes a first planarization layer and a second planarization layer and the second wiring line has a stepped portion at a location corresponding to a boundary of the bending area, and the second planarization layer covers an upper surface of the stepped portion of the second wiring line.

A portion of the planarization layer is between the first and second wiring lines in the bending area of the flexible substrate, and the first and second wiring lines form a double layer wire structure.

A touch screen panel, a polarizing plate, and a cover glass can be further disposed on the active area.

The flexible electroluminescent display apparatus can further include an insulating film connected to the flexible substrate, and a driving element disposed on the insulating film.

A micro-cover layer can be disposed on the bending area.

The semiconductor layer of the thin film transistor can include an area doped with an impurity at a high concentration.

The semiconductor layer can include an area doped with one of impurities including boron (B), aluminum (Al), gallium (Ga), and indium (In) at a high concentration.

The semiconductor layer can include an area doped with one of impurities including phosphorus (P), arsenic (As) and antimony (Sb) at a high concentration.

The first wiring line and the second wiring line can be configured as a plurality of metal layers.

The first wiring line and the second wiring line can be formed into one of a diamond shape, a triangle-wave shape, a sine wave shape, and a trapezoidal shape.

A backplate can be disposed on a lower surface of the active area.

According to another aspect of the present disclosure, there is provided a flexible electroluminescent display apparatus. The flexible electroluminescent display apparatus includes a flexible substrate including an active area and a bending area which is extended from the active area and bent. The flexible electroluminescent display apparatus also includes a planarization layer disposed on the substrate. The flexible electroluminescent display apparatus further includes a first wiring line and a second wiring line disposed in the bending area. The planarization layer is disposed on the first wiring line, the second layer is disposed on the planarization layer, and the first wiring line and the second wiring line are directly connected to each other to receive the same signal.

The planarization layer includes a first planarization layer and a second planarization layer, and the second wiring line has a stepped portion at a location corresponding to a boundary of the bending area, and the second planarization layer covers an upper surface of the stepped portion of the second wiring line.

The first and second wiring lines form a wire that transitions from a single layer wire into a double layer wire at a location corresponding to a boundary of the bending area.

The first wiring line and the second wiring line can be configured as a plurality of metal layers.

The first wiring line and the second wiring line can be formed into one of a diamond shape, a triangle-wave shape, a sine wave shape, and a trapezoidal shape.

A touch screen panel, a polarizing plate, and a cover glass can be further disposed on the active area.

The flexible electroluminescent display apparatus can further include an insulating film connected to the flexible substrate, and a driving element disposed on the insulating film.

A micro-cover layer can be disposed on the bending area.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A flexible electroluminescent display apparatus, comprising:
    a flexible substrate including an active area and a bending area extending from the active area;
    a thin film transistor disposed on the active area and including a semiconductor layer, a gate electrode, a source electrode and a drain electrode;
    an planarization layer disposed on the thin film transistor;
    a light emitting element disposed on the planarization layer in the active area and connected to the thin film transistor through a connection electrode; and
    a first wiring line and a second wiring line disposed in the bending area of the flexible substrate,
    wherein the planarization layer includes a first planarization layer and a second planarization layer,
    wherein the first wiring line, the source electrode and the drain electrode are disposed under the first planarization layer,
    wherein the second wiring line and the connection electrode are disposed between the first planarization layer and the second planarization layer, and
    wherein the first wiring line and the second wiring line are directly connected to each other.

2. The flexible electroluminescent display apparatus according to claim 1,
    wherein the second wiring line has a stepped portion at a location corresponding to a boundary of the bending area, and
    wherein the second planarization layer covers an upper surface of the stepped portion of the second wiring line.

3. The flexible electroluminescent display apparatus according to claim 1, wherein a portion of the planarization layer is between the first and second wiring lines in the bending area of the flexible substrate, and
    wherein the first and second wiring lines form a double layer wire structure.

4. The flexible electroluminescent display apparatus according to claim 1, further comprising:
    a touch screen panel disposed on the active area;
    a polarizing plate disposed on the active area; and
    a cover glass disposed on the active area.

5. The flexible electroluminescent display apparatus according to claim 1, further comprising:
    an insulating film disposed on the flexible substrate; and
    a driving element disposed on the insulating film.

6. The flexible electroluminescent display apparatus according tee daft further comprising:
    a micro-cover layer disposed on the bending area of the flexible substrate.

7. The flexible electroluminescent display apparatus according to claim 1, wherein the semiconductor layer of the thin film transistor includes an area doped with an impurity.

8. The flexible electroluminescent display apparatus according to claim 7, wherein the area doped with the impurity includes boron (B), aluminum (Al), gallium (Ga), or indium (In).

9. The flexible electroluminescent display apparatus according to claim 7, wherein the area doped with the impurity includes phosphorus (P), arsenic (As) or antimony (Sb).

10. The flexible electroluminescent display apparatus according to claim 1, wherein each of the first wiring line and the second wiring line includes a plurality of metal layers.

11. The flexible electroluminescent display apparatus according to claim 1, wherein the first wiring line and the second wiring line are formed into one of a diamond shape, a triangle-wave shape, a sine wave shape, or a trapezoidal shape.

12. The flexible electroluminescent display apparatus according to claim 1, further comprising:
    a backplate disposed on a lower surface of the active area.

* * * * *